(12) United States Patent  
Jeong

(10) Patent No.: US 7,973,374 B2
(45) Date of Patent: Jul. 5, 2011

(54) SEMICONDUCTOR DEVICE AND METHOD FOR FABRICATING THE SAME

(75) Inventor: Eun-Soo Jeong, Eumseong-gun (KR)

(73) Assignee: Dongbu HiTek Co., Ltd., Seoul (KR)

( * ) Notice: Subject to any disclaimer, the term of this patent is extended or adjusted under 35 U.S.C. 154(b) by 196 days.

(21) Appl. No.: 12/330,666

(22) Filed: Dec. 9, 2008

(65) Prior Publication Data

US 2009/0146229 A1   Jun. 11, 2009

(30) Foreign Application Priority Data

Dec. 10, 2007 (KR) .................. 10-2007-0127512

(51) Int. Cl.
*H01L 29/84* (2006.01)

(52) U.S. Cl. ........ 257/415; 977/708; 977/724; 977/732; 257/467; 257/E27.008; 438/50; 438/54

(58) Field of Classification Search .................. None
See application file for complete search history.

(56) References Cited

U.S. PATENT DOCUMENTS

| | | | |
|---|---|---|---|
| 6,171,879 B1 | 1/2001 | Chan et al. | |
| 6,275,320 B1 * | 8/2001 | Dhuler et al. | 359/237 |
| 6,696,369 B2 | 2/2004 | Fraser et al. | |
| 6,852,926 B2 | 2/2005 | Ma et al. | |
| 6,872,902 B2 | 3/2005 | Cohn et al. | |
| 2004/0150939 A1 * | 8/2004 | Huff | 361/277 |
| 2004/0159532 A1 | 8/2004 | Tatic-Lucie et al. | |
| 2006/0038643 A1 * | 2/2006 | Xu et al. | 335/78 |
| 2006/0087716 A1 | 4/2006 | Kweon et al. | |
| 2007/0018761 A1 | 1/2007 | Yamanaka et al. | |

FOREIGN PATENT DOCUMENTS

| | | |
|---|---|---|
| EP | 1 405 821 | 7/2004 |
| GB | 1 272 645 | 5/1972 |
| KR | 10-2006-0036976 | 5/2006 |

* cited by examiner

*Primary Examiner* — Scott Wilson
(74) *Attorney, Agent, or Firm* — Sherr & Vaughn, PLLC

(57) ABSTRACT

Embodiments relate to a semiconductor device and a method for fabricating the same. According to embodiments, a semiconductor device may include a metal film spaced from a semiconductor substrate at a predetermined interval and in which a plurality of etching holes are formed. A bottom metal pattern disposed on and/or over a space between the semiconductor substrate and metal film and top metal pattern formed on and/or over the bottom metal pattern may be provided. A pillar may be formed on and/or over the semiconductor substrate and may support one side of a low surface of the bottom metal pattern. A pad may be formed on and/or over the semiconductor substrate, and an air layer corresponding to the bottom metal pattern may be inserted therein. According to embodiments, a pyro-electric switch transistor using a bimetal with different coefficients of thermal expansion may be provided.

16 Claims, 5 Drawing Sheets

US 7,973,374 B2

SEMICONDUCTOR DEVICE AND METHOD FOR FABRICATING THE SAME

Figure 1:
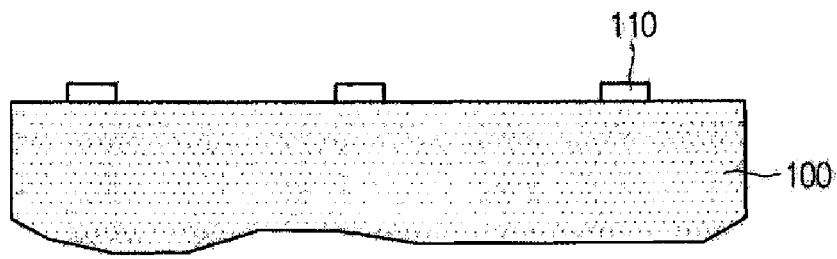

The present application claims priority under 35 U.S.C. 119 to Korean Patent Application No. 10-2007-0127512 (filed on Dec. 10, 2007), which is hereby incorporated by reference in its entirety.

BACKGROUND

Information and communication technologies have rapidly increased and information media, such as computers and the like, may become more popular. Hence, semiconductor apparatuses may be increasingly developed. In addition, semiconductor devices may be more highly integrated in view of a functional aspect. Accordingly, various methods have been studied and developed to reduce a feature size of individual devices formed on and/or over a substrate and to maximize a performance of a device.

A related art method for fabricating a semiconductor device may manufacture a switch transistor having turn-on and turn-off functions using movement of electrons according to a tunneling effect. Such a method, however, may require many process steps, which may reduce yields.

SUMMARY

Embodiments relate to a semiconductor device and a method for fabricating the same. Embodiments relate to a semiconductor device having a switch function, and a method for fabricating the same. Embodiments relate to a semiconductor device, which may have a pyro-electric switch transistor using a bi-metal, and a method for fabricating the same.

According to embodiments, a semiconductor may include at least one of the following. A metal film spaced from a semiconductor substrate at a predetermined interval and in which a plurality of etching holes may be formed. A bottom metal pattern disposed on and/or over a space, spaced between the semiconductor substrate and metal film and top metal pattern formed on and/or over the bottom metal pattern. A pillar formed on and/or over the semiconductor substrate and supporting one side of a low surface of the bottom metal pattern. A pad formed on and/or over the semiconductor substrate, with an air layer corresponding to the bottom metal pattern inserted therein.

According to embodiments, a method for fabricating a semiconductor device may include at least one of the following. Forming a pad on and/or over a semiconductor substrate. Forming a first dielectric film having hole covering the pad. Forming a pillar within a hole, a bottom metal pattern, and a top metal pattern, respectively, whose one side may be connected to the pillar by sequentially forming on and/or over the first dielectric film and patterning a bottom metal film and a top metal film gap-filling the holes and having different coefficients of thermal expansion. Forming a second dielectric film on and/or over the first dielectric film to cover the bottom metal pattern and the metal pattern. Forming a metal film in which an etching hole is formed on and/or over the second dielectric film. Removing the first dielectric film and second dielectric film by infiltrating an etching liquid through the etching hole.

DRAWINGS

Example FIGS. 1 through 9 are cross-sectional views illustrating a semiconductor device and a method of fabricating a semiconductor device, according to embodiments.

DESCRIPTION

Example FIGS. 1 through 9 are cross-sectional views illustrating a semiconductor device and a method for fabricating a semiconductor device according to embodiments.

Referring to example FIG. 1, a metal film may be deposited and patterned and may form pad 110 on and/or over semiconductor substrate 100. A thickness of pad 110 may be determined by considering a loss according to friction if pad 110 contacts a vibration type driving body in a bi-metal structure of a pyro-electric transistor. The metal film may include at least one of Co, Mo, Ta, W, Ti, Ni, Al, Cu, Pt, Au, and alloys thereof.

Figure 2:
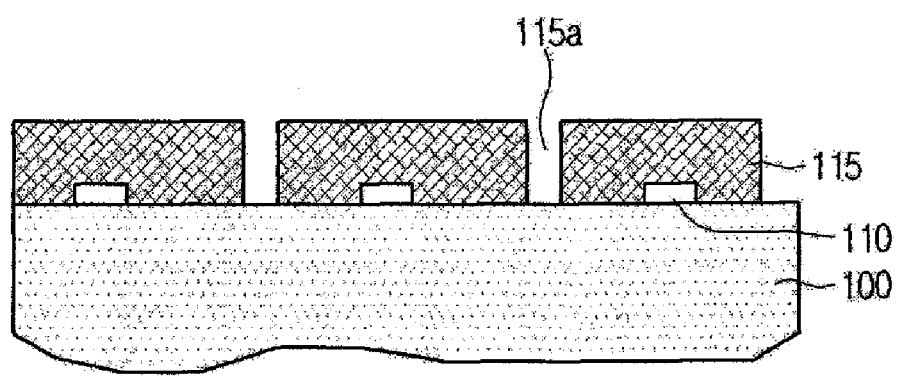

Referring to example FIG. 2, first dielectric film 115 may be formed on and/or over semiconductor substrate 100 on and/or over which pad 110 may be formed. First dielectric film 115, which may be a low temperature oxide (LTO) film, may be formed through a chemical vapor deposition (CVD) method. Hole 115a, where a pillar of a vibration type driving body may be formed, may be formed in first dielectric film 115.

Figure 3:
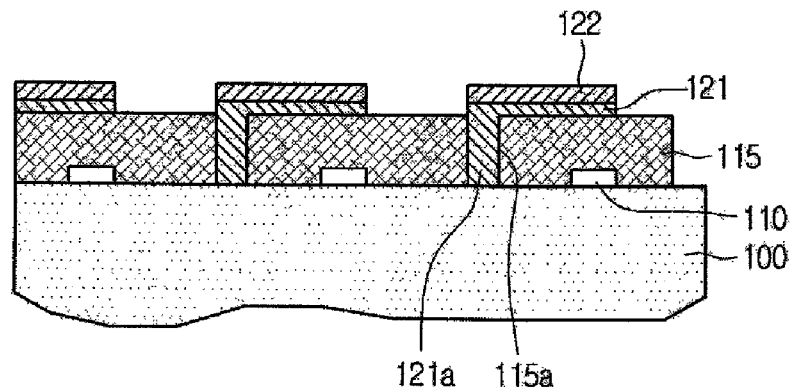

Referring to example FIG. 3, hole 115a may be filled. Hence, a bottom metal film may be formed on and/or over first dielectric film 115 and a top metal film may be formed on and/or over the bottom metal film. A bottom metal film may be formed with a sufficient thickness on and/or over first dielectric film 115. A top metal film may be formed on and/or over the bottom metal film, which may be polished through a chemical mechanical polishing (CMP) and may then be planarized.

A bottom metal film and a top metal film may be made of metal films which may have different coefficients of thermal expansion. According to embodiments, a coefficient of thermal expansion of a top metal film may be larger than a coefficient of thermal expansion of a bottom metal film.

According to embodiments, a top metal film may be aluminum, and a bottom metal film may be nickel. A bottom metal film and a top metal film may be patterned to form bottom metal pattern 121 and top metal pattern 122 on and/or over first dielectric film 115, respectively.

Bottom metal pattern 121 may be connected to pillar 121a within hole 115a. Bottom metal pattern 121 and top metal pattern 122 may be supported by pillar 121a. A vibration type driving body formed having bottom metal pattern 121 and top metal pattern 122 may be a catilever structure.

Figure 4:
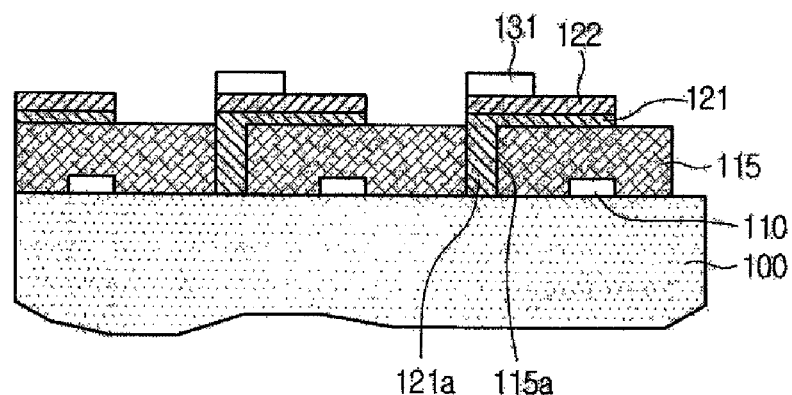

Referring to example FIG. 4, first contact electrode 131 may be formed on and/or over a portion of top metal pattern 122. First contact electrode 131 may apply current to a vibration type driving body. This may allow a vibration type driving body to be bent due to a difference in coefficients of thermal expansion, which may allow the vibration type driving body to contact pad 110.

First contact electrode 131 may be formed at a location corresponding to pillar 121a formed within hole 115a. Bottom metal pattern 121 and top metal pattern 122 may be connected to pillar 121a and may project outward. When current is applied, bottom metal pattern 121 and top metal pattern 122 may bend. Bottom metal pattern 121 and top metal pattern 122 may contact pad 110 if they bend. Bottom metal pattern 121 and top metal pattern 122 may not be bent when first contact electrode 131 is formed on and/or over a bending location. First contact electrode 131 may include at least one of Co, Mo, Ta, W, Ti, Ni, Al, Cu, Pt, Au, and alloys thereof.

Figure 5:
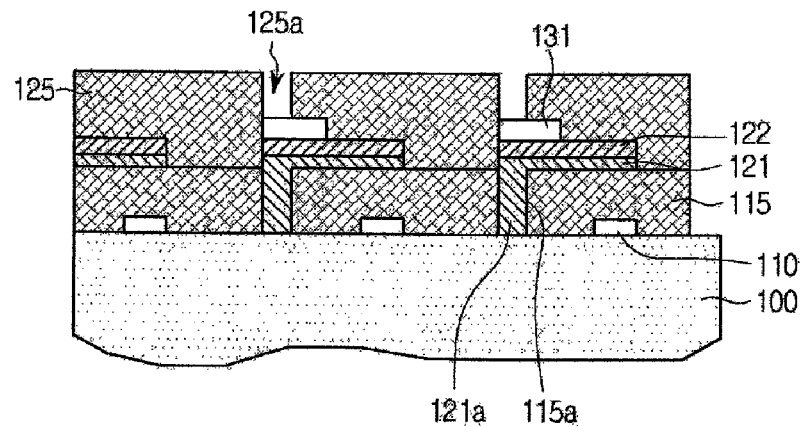

Referring to example FIG. 5, second dielectric film 125 may be formed on and/or over first dielectric film 115 on and/or over which a vibration type driving body and first contact electrode 131 may be formed. Second dielectric film 125 may be a low temperature oxide (LTO) film, and may be formed through a chemical vapor deposition (CVD) method. According to embodiments, via hole 125a may expose a portion of first contact electrode 131 and may be formed in second dielectric film 125.

According to embodiments, when forming via hole 125a, a deep via hole may be formed, and may penetrate through first dielectric film 115 and second dielectric film 125 and may be connected electrically to pad 110 formed on and/or over semiconductor substrate 100. While the deep via hole is formed, first contact electrode 131, which may be exposed by via hole 125a, may function as an etch stop film. A portion of exposed first contact electrode 131 may thereby be etched. According to embodiments, a separate etch stop film may also be formed on and/or over a top of first contact electrode 131.

Figure 6:
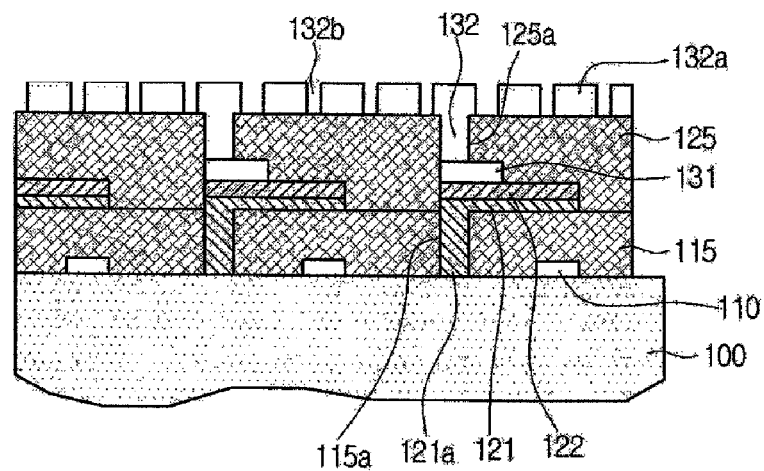

Referring to example FIG. 6, second contact electrode 132 may be formed by forming and patterning metal film 132a on and/or over second dielectric film 125 and may be buried within via hole 125a. According to embodiments, a plurality of etching holes 132b, which may expose second dielectric film 125, may be formed in metal film 132a and may be spaced from second contact electrode 132.

Figure 7:
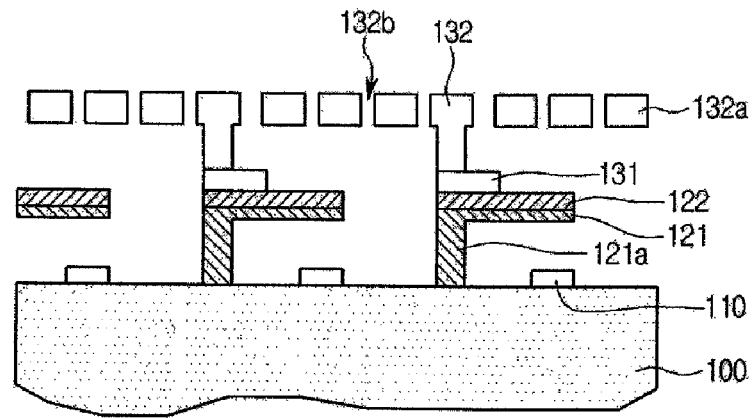

Referring to example FIG. 7, a wet etching process may be performed. According to embodiments, an etching liquid may be provided into etching hole 132b, which may be formed in metal film 132a. This may remove first dielectric film 115 and second dielectric film 125 in an inner side.

A vibration type driving body, which may be connected to pillar 121a and which may project laterally, may be formed on and/or over semiconductor substrate 100. A vibration type driving body may be bent by forming an air layer around the vibration type driving body. This may make it possible to contact pad 110.

Figure 8:
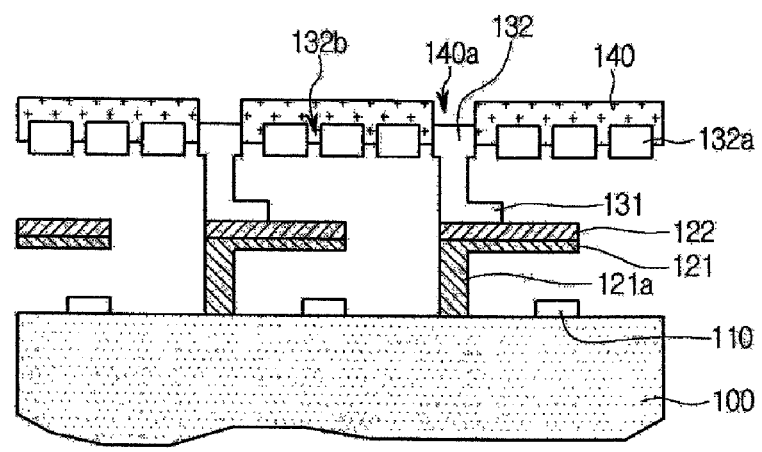

Referring to example FIG. 8, third dielectric film 140 may be formed on and/or over metal film 132a in which etching hole 132b may be formed. Third dielectric film 140 may cover the plurality of etching holes 132b formed in metal film 132a. According to embodiments, contact hole 140a may expose second contact electrode 132 and may be formed by patterning third dielectric film 140.

Figure 9:
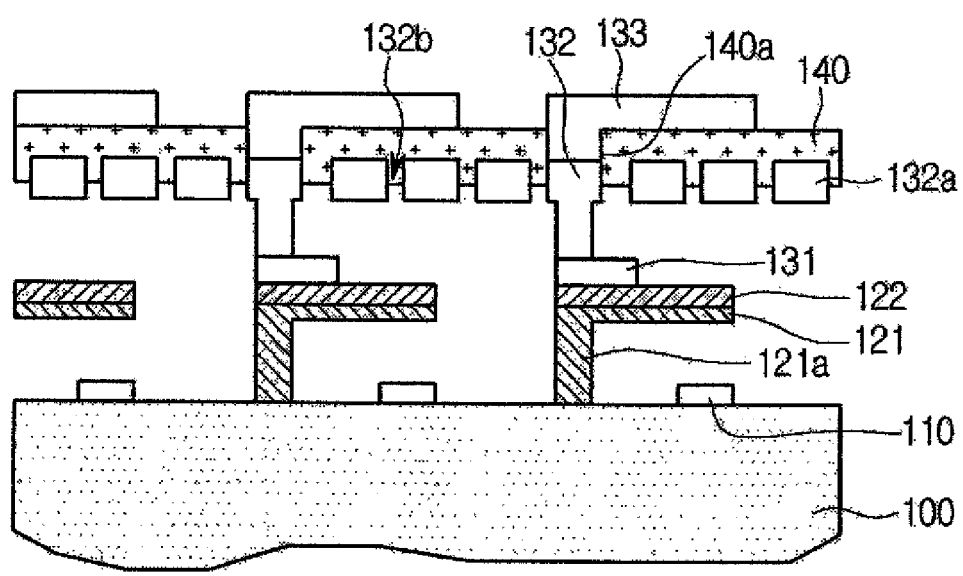

Referring to example FIG. 9, a metal film may be formed and patterned on and/or over third dielectric film 140 in which contact hole 140a may be formed. This may form metal wire 133. According to embodiments, metal wire 133 may contact second contact electrode 132. Metal wire 133 may include at least one of Co, Mo, Ta, W, Ti, Ni, Al, Cu, Pt, Au, and alloys thereof.

Metal wire 133 may thus be formed on and/or over third dielectric film 140 and may be connected to a separate metal pattern that may be formed within contact hole 140a. According to embodiments, metal wire 133 formed on and/or over third dielectric film 140 and metal wire 133 formed within contact hole 140a may be integrally formed by being buried within contact hole 140a.

According to embodiments, if a current is applied to a pyro-electric switch transistor of a vibration type driving body through metal wire 133, second contact electrode 132 and first contact electrode 131, bottom metal pattern 121 and top metal pattern 122, which may have different coefficient of thermal expansion, may be bent. According to embodiments, bottom metal pattern 121 may contact pad 110, and may thereby be conductive. According to embodiments, if current is not applied, bent bottom metal pattern 121 may return to its original place and may no longer contact pad 110. This may control turn-on and turn-off functions of a switch transistor.

According to embodiments, a semiconductor device and the method for fabricating the same may provide a pyro-electric switch transistor using a bi-metal with different coefficient of thermal expansion. It may be possible to easily manufacture such a transistor through a simple process, which may improve yields. According to embodiments, a transistor having a new structure to shorten processes may be provided. This may reduce a manufacturing cost.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A device, comprising:
a pad formed over a semiconductor substrate;
a pillar formed over the semiconductor substrate adjacent to the pad;
a bottom metal pattern over the pillar having a width that extends beyond a width of the pillar and extends to a position over a location where the pad is formed;
a top metal pattern formed over the bottom metal pattern;
a metal connector coupled to the top metal pattern;
an air layer positioned between the bottom metal pattern and the pad;
a metal film over the top metal pattern and semiconductor substrate at a predetermined interval from the semiconductor substrate, and having a plurality of etching holes formed therein;
a metal wire formed over a top of the metal film, wherein the top metal pattern is electrically connected to the metal wire; and
at least one contact electrode formed over a location corresponding to a position of the pillar and between the top metal pattern and the metal wire,
wherein one side of a bottom surface of the bottom metal pattern is supported by the pillar, one side of an upper surface of the top metal pattern is supported by the contact electrode.

2. The device of claim 1, wherein the bottom metal pattern and the top metal pattern each comprises metal having different coefficients of thermal expansion.

3. The device of claim 2, wherein the coefficient of thermal expansion of the top metal pattern is larger than the coefficient of thermal expansion of the bottom metal pattern.

4. The device of claim 2, wherein the top metal pattern comprises aluminum and the bottom metal pattern comprises nickel.

5. The device of claim 1, wherein the metal wire is electrically connected to the metal connector.

6. The device of claim 1, wherein the metal wire comprises at least one of Co, Mo, Ta, W, Ti, Ni, Al, Cu, Pt, Au, and alloys thereof.

7. The device of claim 1, comprising a dielectric film over the metal film and covering the plurality of etching holes.

8. The device of claim 1, wherein the bottom metal pattern is configured to contact the pad by bending.

9. A method, comprising:
forming a pad over a semiconductor substrate;
forming a first dielectric film over the pad and the semiconductor substrate;
forming a metal pillar over the semiconductor substrate and within the first dielectric film at a location adjacent to the pad;

forming a bottom metal pattern over the pillar and at least a portion of the first dielectric film, the bottom metal pattern having a first coefficient of thermal expansion;

forming a top metal pattern over the bottom metal pattern, the top metal pattern having a second coefficient of thermal expansion different than the first coefficient of thermal expansion;

forming a second dielectric film over the first dielectric film and the top metal pattern;

forming a metal film over the second dielectric film, the metal film having at least one etching hole therein;

removing the first dielectric film and the second dielectric film by providing an etching liquid through the at least one etching hole;

forming a third dielectric film over the metal film to cover the at least one etching hole and the metal film after removing the first dielectric film and the second dielectric film; and forming a metal wire over the third dielectric film and electrically connected to the top metal pattern.

10. The method of claim 9, wherein the metal wire comprises at least one of Co, Mo, Ta, W, Ti, Ni, Al, Cu, Pt, Au, and alloys thereof.

11. The method of claim 9, wherein forming the second dielectric film comprises:

forming a contact hole in the second dielectric film; and forming a contact electrode contacting the top metal pattern over a location where the pillar is disposed, through the contact hole.

12. The method of claim 11, wherein one side of a bottom surface of the bottom metal pattern is supported by the pillar, one side of an upper surface of the top metal pattern is supported by the contact electrode, and an air layer is formed between the metal film and semiconductor substrate when the first dielectric film and second dielectric film are removed.

13. The method of claim 11, comprising forming an air layer between the pad and a bottom surface of the bottom metal pattern.

14. The method of claim 9, comprising forming a contact electrode over an upper portion of the metal pattern at a location where the pillar is disposed.

15. The method of claim 9, wherein the top metal pattern comprises aluminum and the bottom metal pattern comprises nickel.

16. The method of claim 9, wherein the second coefficient of thermal expansion is larger than the first coefficient of thermal expansion.

* * * * *